United States Patent
Kim et al.

(10) Patent No.: US 8,882,312 B2
(45) Date of Patent: Nov. 11, 2014

(54) LIGHT EMITTING DEVICE WITH LIGHT EMITTING DIODES FIXED TO PRINTED CIRCUIT

(75) Inventors: Tae-Joon Kim, Yongin (KR); Sang-Hee Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 576 days.

(21) Appl. No.: 13/206,910

(22) Filed: Aug. 10, 2011

(65) Prior Publication Data

US 2012/0170290 A1    Jul. 5, 2012

(30) Foreign Application Priority Data

Dec. 29, 2010    (KR) .................. 10-2010-0138035

(51) Int. Cl.
*F21V 29/00* (2006.01)
*H05K 1/18* (2006.01)

(52) U.S. Cl.
CPC ................. *H05K 1/186* (2013.01); *H05K 1/189* (2013.01); *H05K 2201/10106* (2013.01); *H05K 2203/061* (2013.01); *H05K 2203/049* (2013.01)
USPC ............ 362/382; 362/391; 362/231; 362/240

(58) Field of Classification Search
USPC .................... 362/382, 391, 231, 240
See application file for complete search history.

(56) References Cited

U.S. PATENT DOCUMENTS

2004/0094770 A1    5/2004    Ogihara et al.

FOREIGN PATENT DOCUMENTS

| JP | 2004-179646 A | 6/2004 |
|---|---|---|
| JP | 2009-094323 A | 4/2009 |
| JP | 2009-099497 A | 5/2009 |
| KR | 10-2006-0018288 A | 3/2006 |
| KR | 10-2008-0012511 A | 2/2008 |
| KR | 10-2010-0003469 A | 1/2010 |
| KR | 10-2010-0007822 A | 1/2010 |

*Primary Examiner* — Joseph L Williams
(74) *Attorney, Agent, or Firm* — Knobbe Martens Olson & Bear LLP

(57) ABSTRACT

A light emitting diode package module includes a printed circuit board, a wiring film and light emitting diode packages. The printed circuit board includes first regions and second regions, which are alternately disposed. The wiring film is disposed over the printed circuit board and includes first sections and second sections, which are alternately disposed. Each diode package is disposed between one of the first regions and one of the first sections. The light emitting diode package is electrically connected to the wiring film. The second sections and the second regions are adhered to each other so that the wiring film and the printed circuit board are electrically connected.

8 Claims, 2 Drawing Sheets

LIGHT EMITTING DEVICE WITH LIGHT EMITTING DIODES FIXED TO PRINTED CIRCUIT

CROSS-REFERENCE TO RELATED PATENT APPLICATION

This application claims the benefit of Korean Patent Application No. 10-2010-0138035, filed on Dec. 29, 2010, in the Korean Intellectual Property Office, the disclosure of which is incorporated herein in its entirety by reference.

BACKGROUND

1. Field

The present disclosure relates to light emitting diode package modules, and methods of manufacturing the same.

2. Description of the Related Technology

Recently, various light emitting devices such as light emitting diodes (LEDs) and laser diodes (LDs) have been developed. These light emitting devices have replaced various light sources of display apparatus or backlights by virtue of high reliability and low power consumption due to low voltage driving, a small size, lightness and long lifetime.

A light emitting diode package employing light emitting devices includes a package body portion and a LED chip installed in the package body portion. The package has a smaller size, a longer lifetime and lower power consumption than those of an incandescent lamp, a fluorescent lamp, or a discharge light source.

In addition, the characteristics of a light emitting diode package including a LED chip are determined according to color, brightness and a range of brightness intensity. The characteristics of the LED chip are primarily determined according to a material of a compound semiconductor used in a LED device, and are secondarily determined according to a structure of a package for installing the LED chip therein. It is difficult to achieve high brightness and meet users' requirements of a brightness angle distribution by way of developing only materials of compound semiconductors. Thus, active research has been conducted on the structure of the package.

In particular, resistors, condensers and noise filters have been miniaturized in response to miniaturization and slimness of information and telecommunication devices. In addition, the LED may be installed directly on a printed circuit board (PCB) by using a surface mount device (SMD).

Accordingly, a SMD type LED lamp used in a display device has been developed. The SMD type LED lamp may replace a typical light lamp, and may be used as a lighting display, a character display and an image display, which realize various colors.

As LEDs have been widely used, brightness required for lamps has been increased. Thus, high power LEDs have been widely used.

SUMMARY

One or more aspects of the present invention provide light emitting diode package modules and methods of manufacturing the same, for minimizing height variation of light emitting diode packages bonded to a printed circuit board and preventing the light emitting diode package from tilting horizontally and vertically on the printed circuit board.

According to an aspect of the present invention, there is provided a light emitting diode package module including a printed circuit board comprising first regions and second regions, which are alternately disposed; a wiring film disposed over the printed circuit board, and comprising first sections and second sections, which are alternately disposed; and a light emitting diode package disposed between a first one of the first regions and a first one of the first sections, wherein the light emitting diode package is electrically connected to the wiring film, and wherein the second sections and the second regions are adhered to each other so that the wiring film and the printed circuit board are electrically connected to each other.

A first surface of the light emitting diode package may be adhered to the first one of the first regions, and a second surface of the light emitting diode package may be adhered to the first one of the first sections.

The light emitting diode package may be bonded to the printed circuit board.

The light emitting diode package may include a light emitting device; a body portion including an opening configured to receive the light emitting device therein; and a wire electrically connecting the light emitting device and the wiring film.

A first surface of the body portion may be adhered to the first one of the first regions, and a second surface of the body portion may be adhered to the first one of the first sections.

The body portion may include a through hole through which the wire extends to the wiring film.

The wiring film may include an electric wiring electrically connecting the printed circuit board and the light emitting diode such that power is supplied to the light emitting diode package.

The printed circuit board may include any one selected from a flexible printed circuit board (FPCB), and a metal core printed circuit board (MCPCB).

According to another aspect of the present invention, there is provided a method of manufacturing a light emitting diode package module, the method including providing a wiring film including an electric wiring; bonding a plurality of light emitting diode packages, wherein the plurality of light emitting diode packages are arranged so as to be spaced apart from each other; bonding a printed circuit board to the plurality of light emitting diode packages, wherein the printed circuit board is arranged so as to face the wiring film; bonding the wiring film and the printed circuit board to each other so that the wiring film and the printed circuit board are electrically connected to each other.

The bonding of the plurality of light emitting diode packages may include bonding the wiring film to a first surface of each light emitting diode package.

The bonding of the printed circuit board may include bonding the printed circuit board to a second surface of each light emitting diode package.

The bonding of the plurality of light emitting diode packages may include electrically connecting each light emitting diode package and the wiring film.

The bonding of the wiring film may include pressing and bonding the wiring film and the printed circuit board at a position between two immediately neighboring light emitting diode packages.

Each light emitting diode package may include a light emitting device; a body portion including an opening configured to receive the light emitting device therein; and a wire electrically connecting the light emitting device and the wiring film.

The bonding of the plurality of light emitting diode packages may include bonding the light emitting device and the wiring film by using a wire bonding method.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

The present invention will now be described more fully with reference to the accompanying drawings, in which embodiments of the invention are shown.

Figure 1:
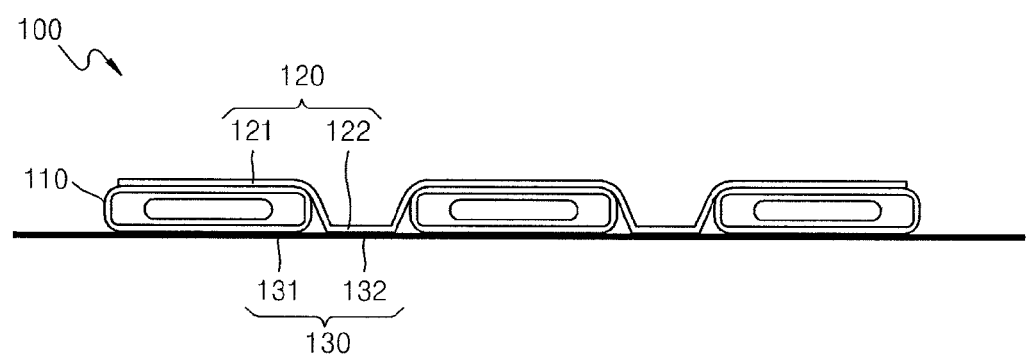
FIG. 1 is a front view of a light emitting diode package module according to an embodiment of the present invention.
Figure 2:
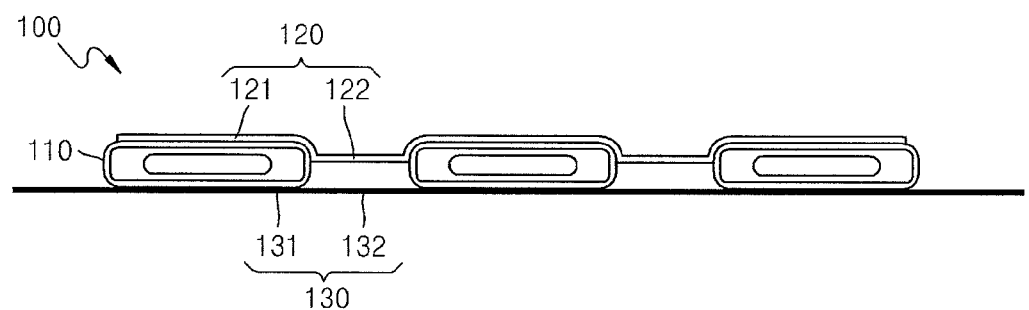
FIG. 2 is a front view of a state before a bonding portion is formed between a wiring film and a printed circuit board in the light emitting diode package module of FIG. 1 according to an embodiment of the present invention.
Figure 3:
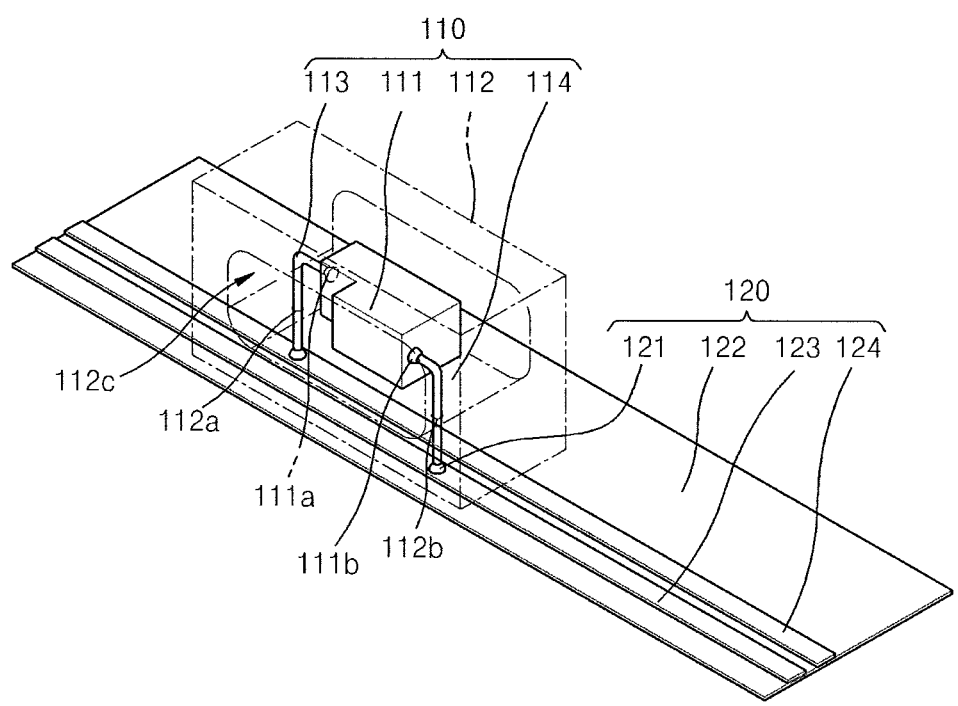
FIG. 3 is a perspective view of a light emitting diode package disposed on a wiring film according to an embodiment of the present invention.

FIG. 1 is a front view of a light emitting diode package module 100 according to an embodiment of the present invention. FIG. 2 is a front view of a state before a press bonding portion is formed between a wiring film 120 and a printed circuit board 130 in the light emitting diode package module 100 of FIG. 1, according to an embodiment of the present invention. FIG. 3 is a perspective view of a light emitting diode package 110 disposed on the wiring film 120 according to an embodiment of the present invention.

Referring to FIG. 1, the light emitting diode package module 100 may include the light emitting diode package 110, the wiring film 120, and the printed circuit board 130.

As illustrated in FIG. 3, the light emitting diode package 110 may include a light emitting device 111, a body portion 112, and a wire 113.

The light emitting device 111 may be a light emitting diode (LED) chip. The LED chip may generate light by using a luminescence (also referred to as 'electroluminescence') that occurs when a voltage is applied to a semiconductor. The LED chip may be formed of a material of which a light emitting wavelength exist in regions of visible ray or near infrared ray, of which light emitting efficiency is high, and by which p-n junction is capable of being formed. The material may be compound semiconductors such as gallium nitride (GaN), gallium arsenide (GaAs), gallium phosphorous (GaP), gallium-arsenic-phosphorus (GaAs1-x Px), gallium-aluminum-arsenic (Ga1-xAlxAs), indium phosphorous (InP), and indium-gallium-phosphorous (In1-xGaxP).

Generally speaking, light is emitted by recombination of free carriers, or recombination in an impurity light-emitting center. In this case, when light is emitted by recombination in an impurity light-emitting center, a wavelength of the light may differ according to a kind of an impurity added to a semiconductor. For example, with regard to GaP, when zinc (Zn) and oxygen (O) are used, red light (of which a wavelength is 700 mm) is emitted, and when nitrogen (N) is used, green light (of which a wavelength is 500 nm) is emitted. That is, according to a kind of an impurity and a material of a semiconductor, light emitted from the light emitting device 111 may have different peculiar colors (wavelengths).

The light emitting device 111 may be fixed to the body portion 112 by using an adhesive agent such as Ag epoxy or eutectic solder.

Referring to FIG. 3, the light emitting device 111 may be connected to the wiring film 120 by using a wire bonding method. The light emitting device 111 includes first and second electrode pads 111a and 111b. The first and second electrode pads 111a and 111b may be a negative electrode, and a positive electrode, respectively. One end of the wire 113 may be connected to the first electrode pad 111a, and the other end of the wire 113 may be connected to an electric wiring 124 of the wiring film 120. One end of a wire 114 may be connected to the second electrode pad 111b, and the other end of the wire 114 may be connected to an electric wiring 123 of the wiring film 120.

An opening 112c for installing the light emitting device 111 therein may be formed in the body portion 112. The opening 112c may have a structure that gives a slope to the light emitting device 111 so as to concentrate light emitted from the light emitting device 111. However, the present embodiment is not limited thereto, and that is, the body portion 112 may have various cup-shaped structures for installing the light emitting device 111 therein.

The body portion 112 may be formed of a plastic resin, for example, thermoplastic resin. The thermoplastic resin may be, for example, a nylon-based resin with an inactive coupler group. The plastic resin may be a resin with high heat resistance such as a liquid crystal polymer (LCP), thermoplastic (polyphenylene sulfide (PPS)), and crystalline polystyrene (syndiotactic polystyrene (SPS)).

Referring to FIGS. 1 and 2, the printed circuit board 130 and the wiring film 120 may be adhered to two lateral surfaces of the body portion 112, which are opposite to each other. A first lateral surface of the body portion 112 may be adhered to a first region 131 of the printed circuit board 130. A second lateral surface of the body portion 112 may be adhered to a first section 121 of the wiring film 120. The printed circuit board 130 and the wiring film 120 may be bonded to the body portion 112 by using an adhesive agent.

Typically, a light emitting diode package is adhered to a printed circuit board by a soldering. Thus, the heights of the light emitting diode packages mounted on the printed circuit board may differ according to the thickness of the soldering. In addition, even a light emitting device package may tilt in the right and left directions on the printed circuit board, and thus light emitting device packages in a light emitting diode package module are not uniformly arranged. If light emitting diode package module is used in a backlight unit, it is important to closely attach a light guiding plate to the light emitting diode package. However, when the light emitting diode package is adhered to the printed circuit board by the soldering, the heights of the light emitting diode packages formed on the printed circuit board are not uniform, and the arrangement of light emitting diode packages is not uniform, as described above. Thus, the light guiding plate is not closely adhered to the light emitting diode package module, thereby reducing luminescent efficiency of the backlight unit.

According to an embodiment of the present invention, the body portion 112 of the light emitting diode package 110 is bonded onto the printed circuit board 130 or the wiring film 120 by using an adhesive agent, and thus the heights of the light emitting diode packages 110 mounted on the printed circuit board 130 are uniform, and the light emitting diode package 110 is prevented from tilting horizontally and vertically.

The wiring film 120 may include first sections 121 and second sections 122, which are alternately disposed. In the first section 121, the wiring film 120 may be pressed and bonded to the first lateral surface of the light emitting diode package 110. In the second section 122, the light emitting diode package 110 is not disposed. However, the second section 122 is attached to a second region 132 of the printed circuit board 130 so as to be electrically connected to the printed circuit board 130. In this case, the printed circuit board 130 may be connected to an external power source. The external power source may supply power to the light emitting diode package 110 through the second section 122 connected to the second region 132 of the printed circuit board 130.

In embodiments, the wiring film 120 may include the electric wirings 123 and 124. The electric wirings 123 and 124 may be electrically connected to the light emitting device 111 by using a wire bonding method. Particularly, the first electrode pad 111a of the light emitting device 111 may be connected to the electric wiring 124 through the wire 113, and the second electrode pad 111b may be connected to the electric wiring 123 through the wire 114. The wires 113 and 114 may be connected to the first and second electrode pads 111a and 111b via through holes 112a and 112b formed in the body portion 112, respectively.

The printed circuit board 130 may include a flexible printed circuit board (FPCB), or a metal core printed circuit board (MCPCB). In embodiments, the printed circuit board 130 may include first regions 131 and second regions 132, which are alternately disposed. In the first region 131, the printed circuit board 130 may be pressed and bonded to the second lateral surface of the light emitting diode package 110. In the second region 132, the light emitting diode package 110 is not disposed. However, the second region 132 may be attached to the second section 122 of the wiring film 120 so as to be electrically connected to the wiring film 120. The second region 132 and the second section 122 are pressed and bonded to each other so that an external power source connected to the printed circuit board 130 may supply power to the light emitting diode package 110.

Hereinafter, a method of manufacturing a light emitting diode package module will be described.

First, the wiring film 120 is prepared. The wiring film 120 may include a base portion 122, and the electric wirings 123 and 124. The electric wirings 123 and 124 may be formed on the base portion 122 on which the light emitting diode package 110 is disposed.

Then, a plurality of light emitting diode packages 110 are bonded onto the wiring film 120. The wiring film 120 may include the first sections 121 and the second sections 122, which are alternately disposed. In the first section 121, the wiring film 120 may be bonded to the first lateral surface of the light emitting diode package 110. In the second section 122, the light emitting diode package 110 may not be disposed. However, the second section 122 may be attached to the second region 132 of the printed circuit board 130 so as to be electrically connected to the printed circuit board 130. In this case, the printed circuit board 130 may be connected to an external power source. The external power source may supply power to the light emitting diode package 110 through the second section 122 connected to the second region 132 of the printed circuit board 130.

The wiring film 120 may include the electric wirings 123 and 124. The electric wirings 123 and 124 may be electrically connected to the light emitting device 111 by using a wire bonding method. That is, the first electrode pad 111a of the light emitting device 111 may be connected to the electric wiring 124 through the wire 113, and the second electrode pad 111b may be connected to the electric wiring 123 through the wire 114.

Then, the printed circuit board 130 is arranged and bonded to the light emitting diode package 110 so as to face the wiring film 120. In particular, the wiring film 120 is bonded to the first lateral surface of the light emitting diode package 110, and the printed circuit board 130 is bonded to the second lateral surface of the light emitting diode package 110. Since the body portion 112 of the light emitting diode package 110 is bonded onto the printed circuit board 130 by an adhesive agent, the heights of the light emitting diode packages 110 mounted on the printed circuit board 130 are uniform, and the light emitting diode package 110 may be prevented from tilting horizontally and vertically.

Then, the wiring film 120 and the printed circuit board 130 are bonded to each other so as to be electrically connected to each other. The wiring film 120 may include the first sections 121 and the second sections 122, which are alternately disposed. The printed circuit board 130 may include the first regions 131 and the second regions 132, which are alternately disposed. The light emitting diode package 110 is disposed in the first section 121 and the first region 131, and the second section 122 and the second region 132 are pressed and bonded to each other. The second region 132 may be securely attached to the second section 122 of the wiring film 120 so as to be electrically connected to the wiring film 120. The second region 132 and the second section 122 are pressed and bonded to each other so that an external power source connected to the printed circuit board 130 may supply power to the light emitting diode package 110.

As described above, according to the one or more of the above embodiments of the present invention, the heights of light emitting diode packages mounted on a printed circuit board are uniform, and the light emitting diode package is prevented from tilting horizontally and vertically on the printed circuit board.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A light emitting diode package module comprising:
   a printed circuit board comprising first regions and second regions, which are alternately disposed;
   a wiring film disposed over the printed circuit board, and comprising first sections and second sections, which are alternately disposed; and
   a light emitting diode package disposed between a first one of the first regions and a first one of the first sections,
   wherein the light emitting diode package is electrically connected to the wiring film, and
   wherein the second sections and the second regions are adhered to each other so that the wiring film and the printed circuit board are electrically connected to each other.

2. The light emitting diode package module of claim 1, wherein a first surface of the light emitting diode package is adhered to the first one of the first regions, and
   wherein a second surface of the light emitting diode package is adhered to the first one of the first sections.

3. The light emitting diode package module of claim 2, wherein the light emitting diode package is bonded to the printed circuit board.

4. The light emitting diode package module of claim 1, wherein the light emitting diode package comprises:
   a light emitting device;
   a body portion comprising an opening configured to receive the light emitting device therein; and
   a wire electrically connecting the light emitting device and the wiring film.

5. The light emitting diode package module of claim 4, wherein a first surface of the body portion is adhered to the first one of the first regions, and wherein a second surface of the body portion is adhered to the first one of the first sections.

6. The light emitting diode package module of claim 4, wherein the body portion comprises a through hole through which the wire extends to the wiring film.

7. The light emitting diode package module of claim 1, wherein the wiring film comprises an electric wiring electrically connecting to the printed circuit board and the light emitting diode such that power is supplied to the light emitting diode package.

8. The light emitting diode package module of claim 1, wherein the printed circuit board comprises any one selected from a flexible printed circuit board (FPCB), and a metal core printed circuit board (MCPCB).

* * * * *

UNITED STATES PATENT AND TRADEMARK OFFICE
CERTIFICATE OF CORRECTION

PATENT NO. : 8,882,312 B2  Page 1 of 1
APPLICATION NO. : 13/206910
DATED : November 11, 2014
INVENTOR(S) : Tae-Joon Kim It is certified that error appears in the above-identified patent and that said Letters Patent is hereby corrected as shown below:

On the Title Page, (Item 54), and in the Specification, column 1, line 3, Title, after "CIRCUIT" insert --BOARD--.

Signed and Sealed this
Sixteenth Day of June, 2015

Michelle K. Lee
*Director of the United States Patent and Trademark Office*